(12) United States Patent
Motonaga

(10) Patent No.: US 10,735,679 B2
(45) Date of Patent: Aug. 4, 2020

(54) IMAGE PICKUP DEVICE AND IMAGING APPARATUS

(71) Applicant: CANON KABUSHIKI KAISHA, Tokyo (JP)

(72) Inventor: Yusaku Motonaga, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/567,437

(22) PCT Filed: May 25, 2016

(86) PCT No.: PCT/JP2016/002530
§ 371 (c)(1),
(2) Date: Oct. 18, 2017

(87) PCT Pub. No.: WO2016/194340
PCT Pub. Date: Dec. 8, 2016

(65) Prior Publication Data
US 2018/0115724 A1    Apr. 26, 2018

(30) Foreign Application Priority Data

May 29, 2015   (JP) .................................. 2015-109427
Apr. 22, 2016   (JP) .................................. 2016-086545

(51) Int. Cl.
*H04N 5/355*        (2011.01)
*H04N 5/374*        (2011.01)
(Continued)

(52) U.S. Cl.
CPC ..... *H04N 5/35554* (2013.01); *H01L 27/1464* (2013.01); *H01L 27/14634* (2013.01);
(Continued)

(58) Field of Classification Search
CPC ............. H04N 5/35554; H04N 5/2355; H04N 5/2356; H04N 5/3535; H04N 5/3742; H04N 5/378; H01L 27/14634; H01L 27/1464
See application file for complete search history.

(56) References Cited

U.S. PATENT DOCUMENTS 8,456,555 B2   6/2013   Um et al.
8,699,821 B2   4/2014   Orr, IV et al.
(Continued)

FOREIGN PATENT DOCUMENTS

CN   103069453 A   4/2013
CN   103973958 A   8/2014
(Continued)

OTHER PUBLICATIONS

Office Action dated Jun. 27, 2017, in Japanese Patent Application No. 2016-086545.
(Continued)

*Primary Examiner* — Twyler L Haskins
*Assistant Examiner* — Fayez Bhuiyan
(74) *Attorney, Agent, or Firm* — Venable LLP

(57) ABSTRACT

HDR image generating processing is performed which generates one image from a plurality of images captured with different exposures within an image pickup device so that increases of power consumption and frame rate reduction can be improved.

14 Claims, 17 Drawing Sheets

(51) Int. Cl.

| | |
|---|---|
| *H01L 27/146* | (2006.01) |
| *H04N 5/235* | (2006.01) |
| *H04N 5/353* | (2011.01) |
| *H04N 5/369* | (2011.01) |
| *H04N 5/378* | (2011.01) |

(52) U.S. Cl.
CPC ......... *H04N 5/2355* (2013.01); *H04N 5/2356* (2013.01); *H04N 5/3532* (2013.01); *H04N 5/3535* (2013.01); *H04N 5/35581* (2013.01); *H04N 5/378* (2013.01); *H04N 5/379* (2018.08); *H04N 5/3742* (2013.01)

(56) References Cited

U.S. PATENT DOCUMENTS

| | | | |
|---|---|---|---|
| 8,723,998 B2 | 5/2014 | Maruta et al. | |
| 8,760,537 B2 | 6/2014 | Johnson et al. | |
| 8,773,557 B2* | 7/2014 | Kato | H01L 27/14609 348/294 |
| 8,885,978 B2 | 11/2014 | Cote et al. | |
| 9,137,454 B2 | 9/2015 | Yang et al. | |
| 9,420,198 B2 | 8/2016 | Cote et al. | |
| 10,038,855 B2 | 7/2018 | Cote et al. | |
| 10,341,574 B2 | 7/2019 | Cote et al. | |
| 2007/0177048 A1 | 8/2007 | Van Dyke et al. | |
| 2011/0085065 A1* | 4/2011 | Egawa | H04N 5/357 348/294 |
| 2013/0215290 A1* | 8/2013 | Solhusvik | H04N 5/2355 348/231.99 |
| 2015/0002715 A1* | 1/2015 | Ise | H04N 5/23212 348/308 |

FOREIGN PATENT DOCUMENTS

| | | |
|---|---|---|
| CN | 104349069 A | 2/2015 |
| FR | 2996034 A1 | 3/2014 |
| JP | 2003-319269 A | 11/2003 |
| JP | 2004-048421 A | 2/2004 |
| JP | 2006-229627 A | 8/2006 |
| JP | 2006-237772 A | 9/2006 |
| JP | 2008-118389 A | 5/2008 |
| JP | 2013-026675 A | 2/2013 |
| JP | 2015-041792 A | 3/2015 |
| KR | 10-2009-0000503 A | 1/2009 |

OTHER PUBLICATIONS

U.S. Appl. No. 15/353,103, filed Nov. 16, 2016 (First Named Inventor: Satoshi Suzuki).
U.S. Appl. No. 15/355,460, filed Nov. 18, 2016 (First Named Inventor: Yoshiaki Miyamoto).
U.S. Appl. No. 15/567,145, filed Oct. 17, 2017 (First Named Inventor: Makoto Ise).
Search Report dated Sep. 24, 2018, in European Patent Application No. 16802782.9.
Office Action dated Oct. 8, 2018, in Korean Patent Application No. 10-2017-7032189.
Communication dated May 10, 2019. in European Patent Application No. 16802782.9.
Office Action dated Jul. 29, 2019, in Chinese Patent Application No. 201680031420.3.
Office Action dated Dec. 13, 2019, in European Patent Application No. 16802782.9.
Office Action dated Oct. 29, 2019 in Korean Patent Application No. 10-2019-7025562.
Office Action dated May 19, 2020, in Korean Patent Application No. 10-2019-7025562.

* cited by examiner

IMAGE PICKUP DEVICE AND IMAGING APPARATUS

TECHNICAL FIELD

The present invention relates to an image pickup device and an imaging apparatus.

BACKGROUND ART

In recent years, as disclosed in PTL 1, a CMOS image pickup device, for example, for use in an imaging apparatus such as a digital camera may include an increased number of pixels because of miniaturization of pixels and are capable of capturing high-definition images. Recent imaging apparatuses for consumers may generally include 10 million pixels or more.

FIG. 16 is a configuration block diagram of such a general imaging apparatus. Referring to FIG. 16, an image pickup device 1500 includes a pixel part 1501, an AD conversion unit 1502, and a P/S conversion unit 1503. The pixel part 1501 converts a subject image to an electrical signal and outputs it to the AD conversion unit 1502.

The AD conversion unit 1502 converts an image signal read from the pixel part 1501 to a digital signal. The P/S conversion unit 1503 performs parallel-serial conversion on the digital signal converted by the AD conversion unit 1502. An image signal processing circuit 1600 performs a signal process on an image signal from the image pickup device 1500.

The imaging apparatus has a transfer path having a constant transfer capability for transferring an image signal from the image pickup device 1500 to the image signal processing circuit 1501. Thus, an increased number of pixels in the image pickup device may relatively result in an increased transfer time of all image signals of a subject.

In other words, the speed for reading signals from the image pickup device 1500 to the image signal processing circuit 1501 may be a bottleneck of the speed for reading out image signals. Furthermore, such high speed transfer may increase the amount of power consumed and the amount of heat generated by the transfer circuit and the processing circuit, which may reduce the precision of the data transfer.

In HDR photographing processing, an imaging element is used to capture a plurality of images with different exposures, and data of the plurality of images is output to an image processing circuit provided externally to the image pickup device and is synthesized to generate an HDR image. This processing may require transmission of data of the plurality of images to the image processing circuit provided externally to the image pickup device, which disadvantageously may increase the amount of data to be transmitted from the image pickup device to the image processing circuit and also increase power consumption.

CITATION LIST

Patent Literature

PTL 1: Japanese Patent Laid-Open No. 2013-26675

SUMMARY OF INVENTION

The present invention provides an image pickup device by which high-quality image having a wide dynamic range can be acquired.

The present invention provides an image pickup device having a first semiconductor substrate and a second semiconductor substrate, the first semiconductor substrate and second semiconductor substrate being mutually stacked, the image pickup device including an imaging unit provided on the first semiconductor substrate and having a plurality of pixels configured to receive and photoelectrically convert incident light, an AD conversion unit configured to convert an analog image signal output from the imaging unit to digital image data, a frame memory provided on the second semiconductor substrate and configured to store digital image data of at least one frame converted by the AD conversion unit, and a generating unit provided on the second semiconductor substrate and configured to generate one image from data of a plurality of images with different exposures stored in the frame memory.

Further features of the present invention will become apparent from the following description of embodiments with reference to the attached drawings.

DESCRIPTION OF EMBODIMENTS

Embodiments of the present invention will be described in detail below with reference to the attached drawings.

First Embodiment

Figure 1:
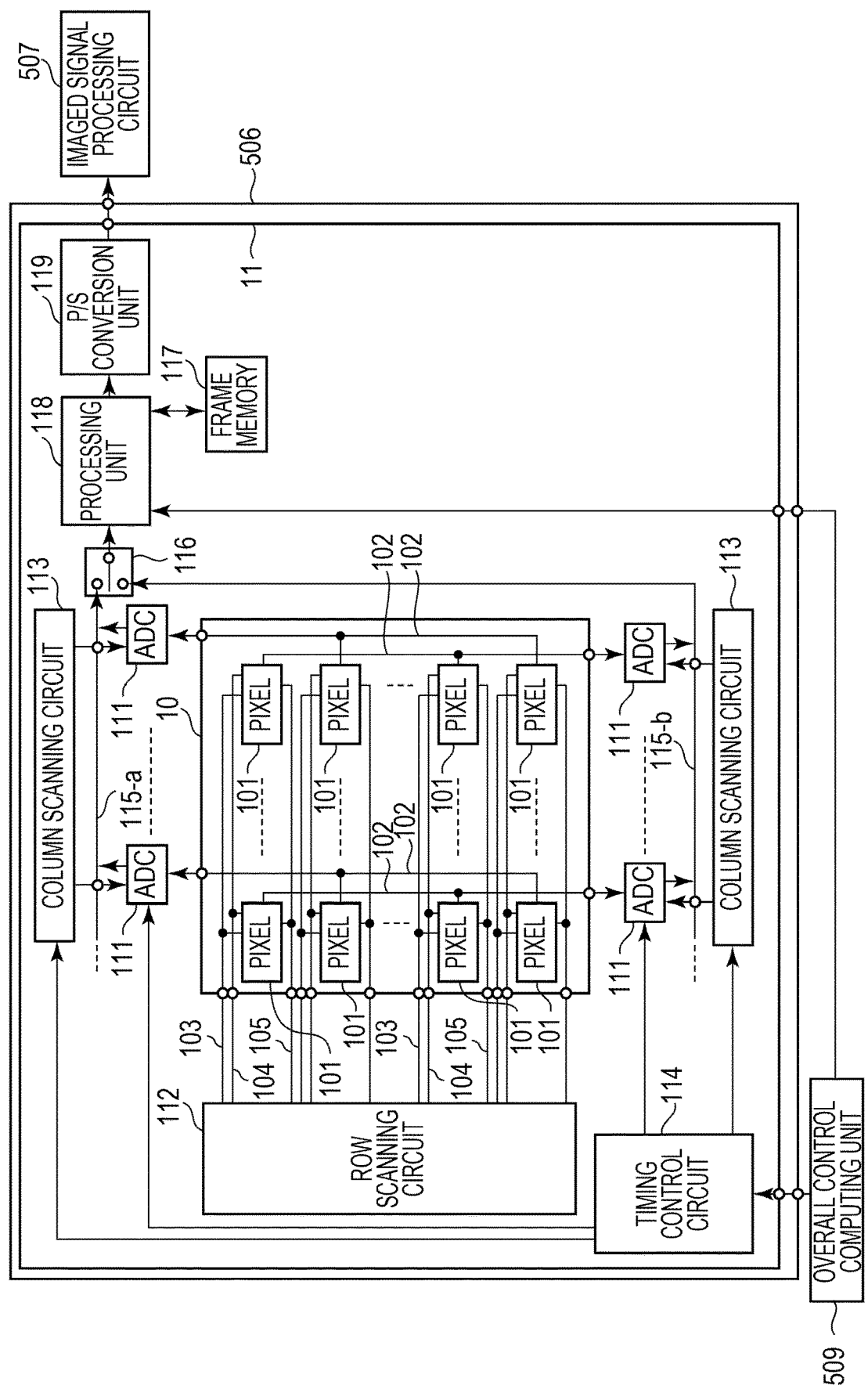
FIG. 1 illustrates a schematic structure of an image pickup device according to a first embodiment.

FIG. 1 is a block diagram schematically illustrating an image pickup device according to the first embodiment of the present invention.

An image pickup device 506 has a first chip (first semiconductor substrate) 10 and a second chip (second semiconductor substrate) 11, and the second chip 11 and the first chip 10 are mutually stacked. The first chip 10 has a pixel part having a plurality of pixels 101 arranged in a matrix form and is provided on a light entrance side (or side for receiving light of an optical image) relative to the second chip 11.

In the pixel part of the first chip 10, the plurality of pixels 101 arranged in a matrix form are connected row by row to a transfer signal line 103, a reset signal line 104, and a row select signal line 105 and are connected column by column to a plurality of column output lines 102. Pixels located in different readout rows of one same column are connected to corresponding one of a plurality of column output lines 102 each provided for one column.

The second chip 11 has a plurality of AD converters (hereinafter, each called an ADC) 111 each provided for one column, a row scanning circuit 112, a column scanning circuit 113, and a timing control circuit 114. The second chip 11 has a changeover switch 116, a frame memory 117, a processing unit 118, a parallel-serial conversion unit (hereinafter, called a P/S conversion unit) 119 and so on. The timing control circuit 114 is drive-controlled by an overall control computing unit 509.

Because of the first chip 10 having the pixel part and the second chip 11 having the drive circuit, for the pixel part, the memory, the computing unit and so on, manufacturing processes may be divided into an imaging layer and a circuit layer of the image pickup device 506. Then, thinning and densification of lines in the circuit layer can increase the speed, reduce the size and improve the functionality.

The changeover switch 116 selectively inputs digital image data of each channel output from a horizontal signal line 115-a and horizontal signal line 115-b provided for each channel to the processing unit 118. The processing unit 118 sorts image data of the channels, generates image data of each one frame and sequentially outputs it to the frame memory 117. The frame memory 117 temporarily stores digital image data of at least one output frame.

The processing unit 118 performs processes such as a cut-out process and a thin-out process on digital image data of one frame stored in the frame memory 117. The digital image data of one frame processed in the processing unit 118 undergo parallel-serial conversion in the P/S conversion unit 119 and are output to an imaged signal processing circuit 507 provided externally to the image pickup device 506.

Here, signal transfer paths between the horizontal signal line 115-a, the horizontal signal line 115-b, the changeover switch 116, the processing unit 118, and the frame memory 117 are digital signal lines provided within an identical chip. This can provide a data bus width necessary for completion of transfer of all horizontal data within a horizontal readout period for higher speed.

Figure 2:
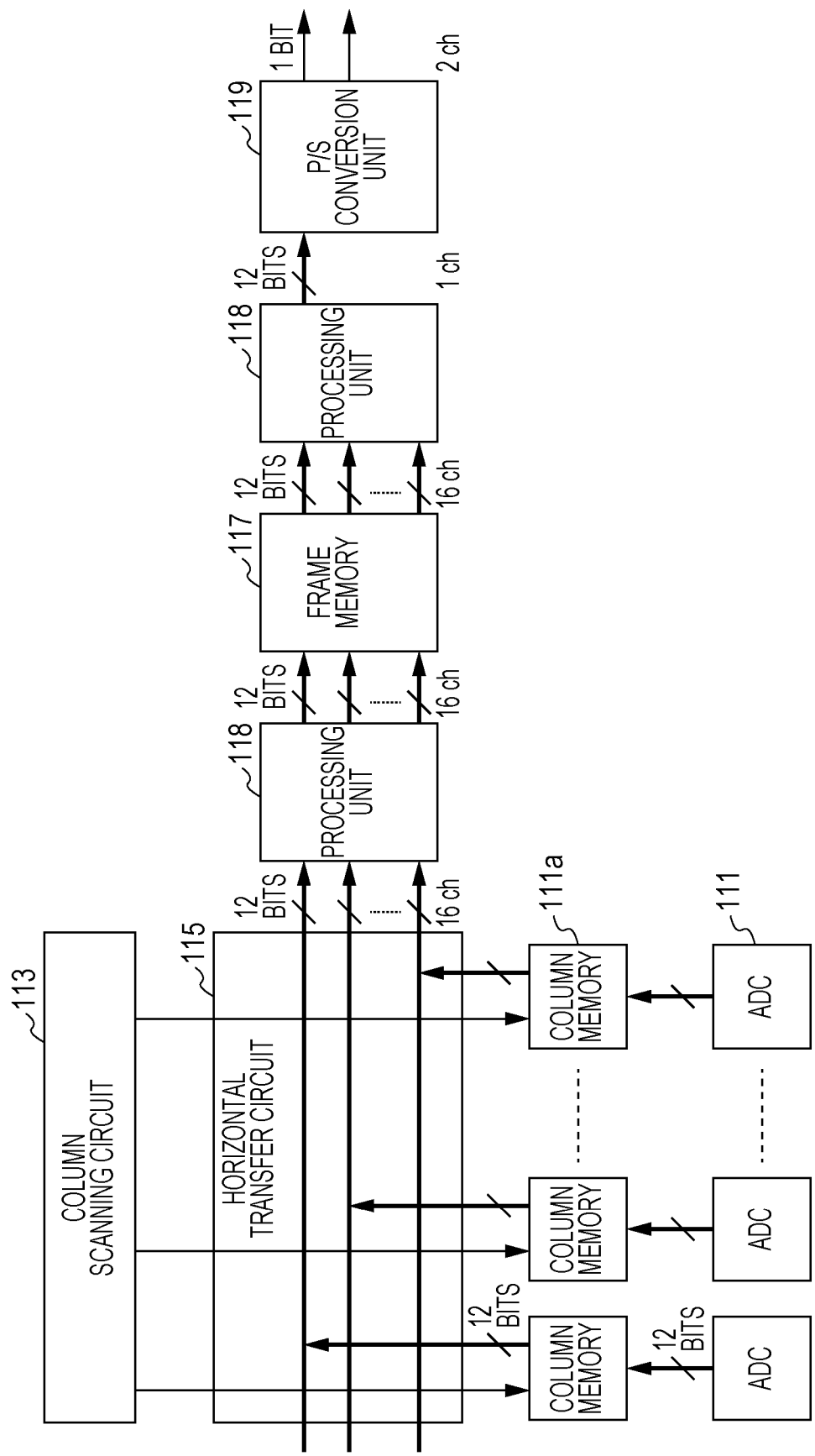
FIG. 2 illustrates an example of a data bus configuration according to the first embodiment.

FIG. 2 illustrates an example of a data bus configuration from the ADC 111 to the P/S conversion unit 119 in the second chip 11. As illustrated in FIG. 2, in the second chip 11, a column memory 111a is provided between the ADC 111 and the processing unit 118 and is configured to temporarily hold an output of the digital conversion performed by the ADC 111. It should be noted that the changeover switch 116 is not illustrated in FIG. 2.

Image data held in the column memory 111a provided for each column are divided into the horizontal signal lines 115-a and 115-b and are output in parallel in accordance with a control signal from the column scanning circuit 113. In this case, 16 channels of the horizontal signal lines 115-a and 115-b are provided within the horizontal transfer circuit 115. The image data output to the horizontal signal lines 115-a and 115-b is input to the frame memory 117 through a memory I/F circuit within the processing unit 118.

A case where image data of 8K4K (horizontal 8000 pixels and vertical 4000 pixels) 32M pixels is output from the ADC 111 will be described, for example. Reading out 32M pixel image data at a frame rate of 60 fps may require a data bus band of 1920M pixel/sec.

In a case where each of the 16 channels of the horizontal signal lines 115-a and 115-b provided within the horizontal transfer circuit 115 has a transfer capability of 12 bits, the transfer capability may be required to reduce to a transferable frequency of 120 MHz. A column memory is selected sequentially in accordance with a control signal from the column scanning circuit 113, and image data of 120M pixel/sec per channel in the horizontal transfer circuit 115 are read out in parallel through the 16 channels.

Of the image data input from the horizontal transfer circuit 115 to the frame memory 117 through the processing unit 118, data of a predetermined area is partially read out from the frame memory and are input again to the processing unit 118. For example, the size of the image data output from the frame memory 117 is reduced to $\frac{1}{16}$ image size by a reducing magnification circuit within the processing unit 118. The data bus band necessary in this case is reduced to 120M pixel/sec. This is the data transfer capability for reading out full-HD size (2M pixel) image data at 60 fps.

The image data with the reduced data bus band output from the processing unit 118 is converted to serial signals in a 720M-bps double channel configuration by the P/S conversion unit 119 so as not to exceed a maximum serial transfer capability of 1 Gbps and is output.

Providing the ADC 111, processing unit 118, and frame memory 117 within the second chip 11 can provide a wide data bus band necessary for processing image data within the second chip 11 and thus can increase the transfer rate from the ADC 111 to the frame memory 117 while a high quality moving image can be output with serial transfer capability allowing external transfer to the image pickup device.

Figure 3:
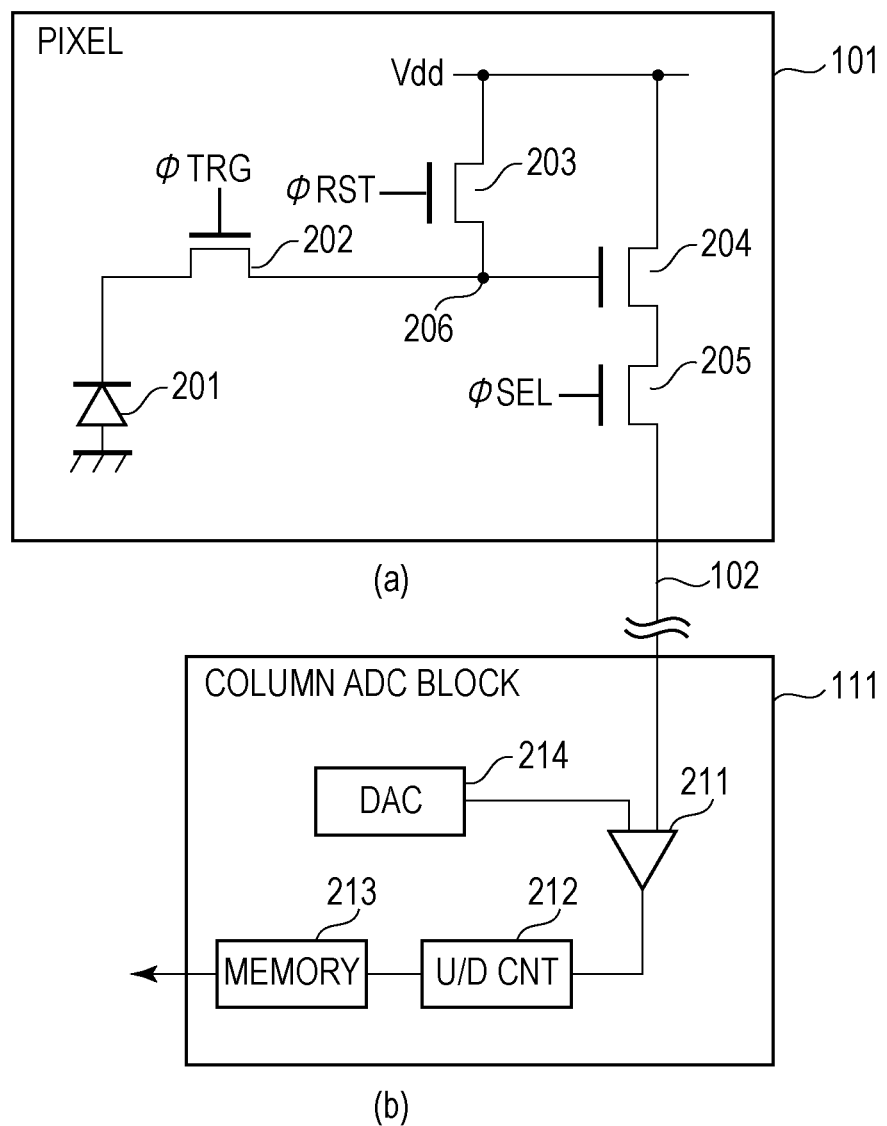
FIG. 3 illustrates a configuration of a pixel and a column ADC block according to the first embodiment.

FIG. 3 illustrates detail configurations of each pixel 101 in the pixel part and the ADC 111 in the image pickup device 506 according to this embodiment. With reference to FIG. 1 and FIG. 3, operations to be performed by the image pickup device according to the first embodiment will be described schematically.

A photodiode (hereinafter, called a PD) 201 photoelectrically converts received incident light to photo charges (electrons here) of the amount of charges corresponding to the amount of light of the received incident light. The PD 201 has a cathode electrically connected to a gate of an amplifying transistor 204 through a transferring transistor 202. The node electrically connected to the gate of the amplifying transistor 204 configures a floating diffusion (hereinafter, called an FD) unit 206.

The transferring transistor 202 is provided between the cathode of the PD 201 and the FD unit 206 and is turned on in response to supply of a transfer pulse pTRG to its gate through the transfer signal line 103 in FIG. 1. The photo charges photoelectrically converted by the PD 201 are transferred to the FD unit 206.

The reset transistor 203 has a drain connected to a pixel power supply Vdd and a source connected to the FD unit 206 and is turned on in response to supply of a reset pulse ΦRST to its gate through the reset signal line 104 in FIG. 1. Before the transfer of signal charges from the PD 201 to the FD unit 206, electric charges in the FD unit 206 are disposed to the pixel power supply Vdd so that the FD unit 206 can be reset.

The amplifying transistor 204 has a gate connected to the FD unit 206 and a drain connected to the pixel power supply Vdd and outputs at a reset level the electric potential of the FD unit 206 after the reset by the reset transistor 203. The amplifying transistor 204 outputs at a signal level the electric potential of the FD unit 206 after the signal charges in the PD 201 are transferred by the transferring transistor 202.

The select transistor 205 may have a drain connected to a source of the amplifying transistor 204 and a source connected to a column output line 102. The select transistor 205 is turned on in response to supply of a select pulse pSEL to its gate through the row select signal line 105 in FIG. 1 and output to the column output line 102 a signal amplified by the amplifying transistor 204 by changing the pixel 101 to a selected state.

It should be noted that the select transistor 205 may be connected between the pixel power supply Vdd and the drain of the amplifying transistor 204. The transistors 202 to 205 may be N channel MOS transistors, for example. Each of the pixels 101 is not limited to the one including the four transistors but may include three transistors where the amplifying transistor 204 and the select transistor 205 are implemented by one transistor.

An analog image signal output from the pixel 101 through the column output line 102 is transmitted to the ADC 111. The ADC 111 has a comparator 211, an up-down counter 212, a memory 213, and a DA converter (hereinafter, called a DAC) 214.

The comparator 211 has a pair of input terminals one of which is connected to the column output line 102 and the other of which is connected to the DAC 214. The comparator 211 has an output terminal connected to the up-down counter 212. The timing control circuit 114 in FIG. 1 outputs a reference signal to the DAC 214 based on an instruction from the overall control computing unit 509.

The DAC 214 outputs a ramp signal changing its level as time proceeds based on the reference signal input from the timing control circuit 114 in FIG. 1. Then, the comparator 211 compares the level of the ramp signal input from the DAC 214 and the level of the image signal input from the column output line 102.

For example, the comparator 211 outputs a higher level comparison signal if the level of an image signal is lower than the level of the ramp signal and outputs a lower level comparison signal if the level of the image signal is higher than the level of the ramp signal. The up-down counter 212 counts a period in which the comparison signal is changed to a high-level or a period in which the comparison signal is changed to a low level. The count processing converts the output signals from the pixels 101 to digital values.

Alternatively, an AND circuit may be provided between the comparator 211 and the up-down counter 212. Pulse signals may be input to the AND circuit, and the number of pulse signals may be counted by the up-down counter 212.

The ADC 111 may count a count value corresponding to the reset level based on a reset signal upon reset release of the pixels 101 and may count the count value based on an optical signal after a lapse of a predetermined imaging period. A difference value between the count value associated with the optical signal and the count value associated with the reset signal may be stored in the memory 213.

The memory 213 is connected to the up-down counter 212 and stores the count value counted by the up-down counter 212. The count value stored in the memory 213 is transmitted as digital image data to the horizontal signal line 115-$a$ and horizontal signal line 115-$b$ in FIG. 1 in response to a drive control from the column scanning circuit 113 in FIG. 1.

Figure 4A:
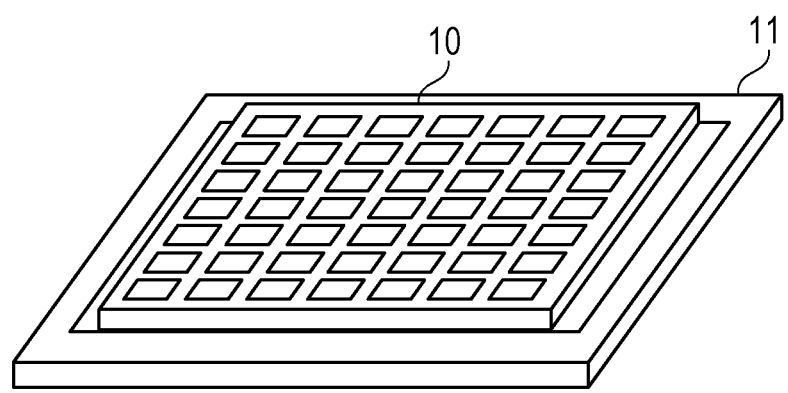
FIG. 4A illustrates a stacked configuration of the image pickup device according to the first embodiment.
Figure 4B:
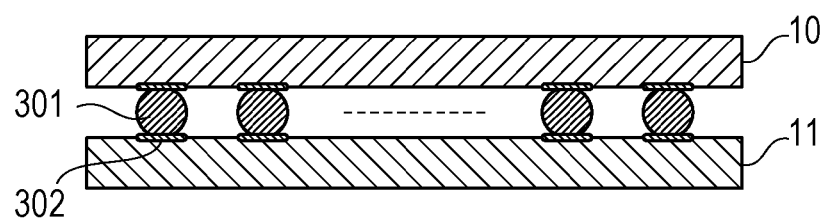
FIG. 4B illustrates a stacked configuration of the image pickup device according to the first embodiment.

FIGS. 4A and 4B illustrate a configuration of an external form of the image pickup device 506 according to the first embodiment described with reference to FIG. 1. FIG. 4A illustrates a perspective view of the image pickup device 506 from the light incident side, and FIG. 4B illustrates a cross sectional view of the image pickup device 506.

The image pickup device 506 includes the first chip (imaging layer) 10 and a second chip (circuit layer) 11. Each of the first chip 10 and the second chip 11 has a plurality of micro pads 302, and the first chip 10 and the second chip 11 are integrated by electrically connecting the micro pads 302 provided in the first chip 10 and the second chip 11 through a plurality of micro bumps 301. In other words, the first chip 10 and the second chip 11 are directly electrically connected through the plurality of macro bumps 101 and the plurality of micro pads 302. The first chip 10 and the second chip 11 may be directly electrically connected by a method without using the macro pads and micro pads.

Figure 5:
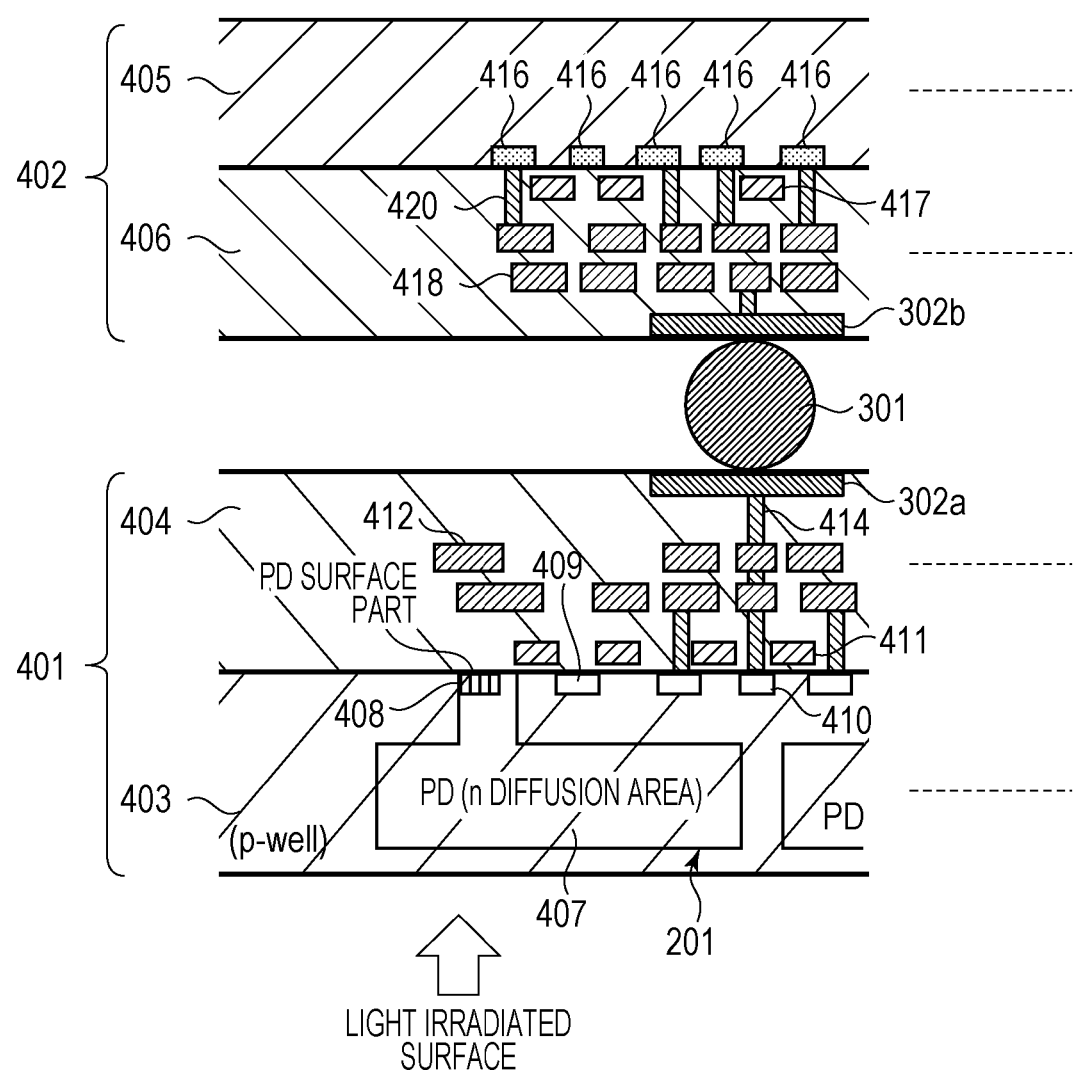
FIG. 5 is a cross sectional view illustrating the image pickup device according to the first embodiment.

FIG. 5 illustrates details of a cross sectional structure of the image pickup device 506 according to the first embodiment illustrated in FIG. 1 to FIGS. 4A and 4B. Referring to FIG. 5, the imaging layer 401 corresponds to the first chip 10, and the circuit layer 402 corresponds to the second chip 11.

In the imaging layer 401, a wiring layer 404 is provided on a silicon (hereinafter, called Si) substrate 403. The Si substrate 403 has an n type diffusion area 407 being the PD 201 and a p+ diffusion area 408 in a surface part (a boundary part with the wiring layer 404 of the wiring layer 404).

The Si substrate 403 has in its surface part a plurality of n+ diffusion areas 409 being the FD unit 206 and a plurality of n+ diffusion areas 410 of switching transistors. The wiring layer 404 has a gate line 411 of the transistor and a signal propagation line 412 within an insulating layer of SiO2, for example, and has a micro pad 302$a$ of Cu in its surface part.

The n+ diffusion area 409, the n+ diffusion area 410 and the gate line 411 of the transistors configure the transferring transistor 202, the reset transistor 203, the amplifying transistor 204, and the select transistor 205. The wiring layer 404 has a via 414 for connecting the n+ diffusion area 410 to the micro pad 302$a$.

The circuit layer 402 has a wiring layer 406 on the Si substrate 405. The Si substrate 405 has, in its surface part, a plurality of transistor diffusion areas 416. The wiring layer 406 has an insulating layer of SiO2, for example, including a plurality of gate lines 417 for the transistors and a plurality of signal propagation lines 418 and a micro pad 302$b$ of Cu, for example, in the surface part.

The transistor diffusion areas 416, gate lines 417 for the transistors, the signal propagation lines 418 provided in the circuit layer 402 configure circuits. The descriptions of details of the circuit cross section will be omitted. The wiring layer 406 has a via 420 for connecting the diffusion areas 416 and so on to the micro pad 302b.

The micro pad 302a provided in the wiring layer 404 of the imaging layer 401 and the micro pad 302b provided in the wiring layer 406 in the circuit layer 402 are electrically connected with each other through the micro bump 301. Though FIG. 5 illustrates a configuration example in which the imaging layer 401 and the circuit layer 402 are connected by using the micro bump 301 as a connection terminal, they may be connected directly without using the micro bump.

Figure 6:
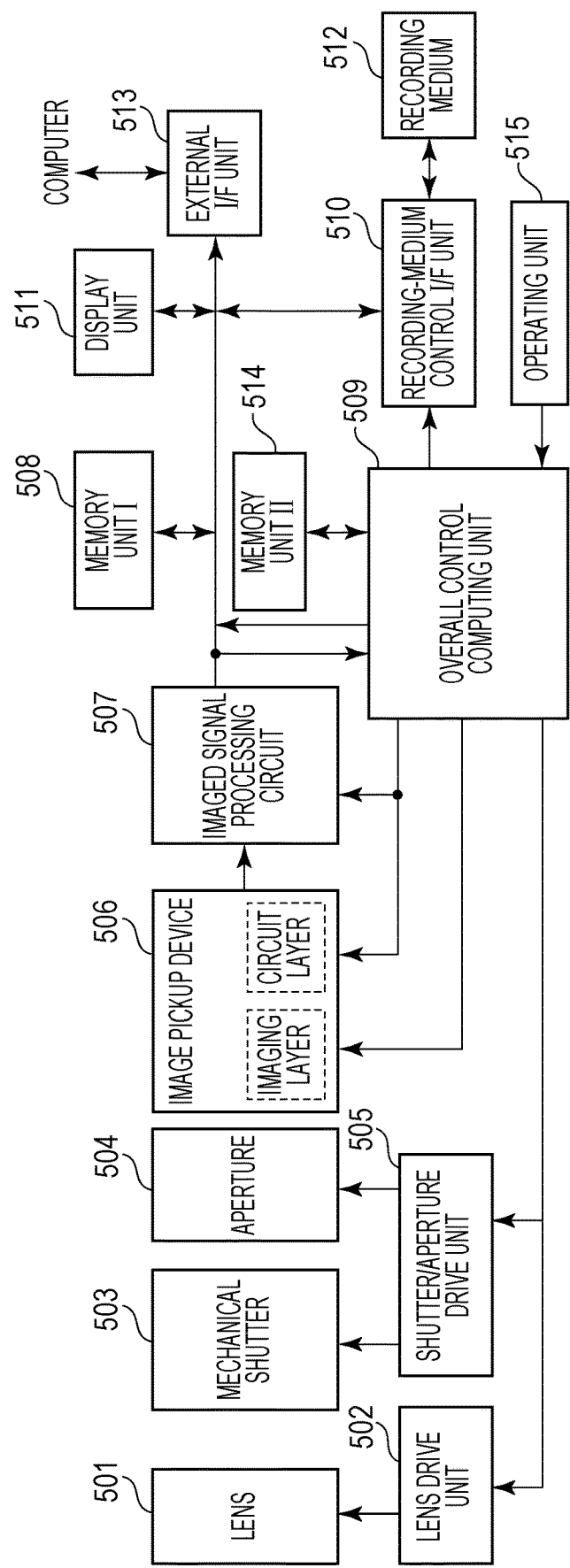
FIG. 6 is a system schematic diagram of an imaging apparatus according to the first embodiment.

FIG. 6 illustrates a system schematic diagram of an imaging apparatus using the image pickup device described with reference to FIGS. 1 to 5. A subject image having passed through a lens unit 501 is adjusted to an appropriate amount of light by an aperture 504 and is focused on an image sensing plane on the image pickup device 506 having the configurations illustrated in FIG. 1 to FIG. 5.

The subject image focused on the image sensing plane on the image pickup device 506 is photoelectrically converted by the PD 201 in the image pickup device 506 and undergoes gain adjustment performed by an amplifier within pixels and a column amplifier provided between the pixels 101 and the ADC 111. The ADC 111 is then used to perform A/D conversion processing from the analog signals to digital signals which are then supplied to the imaged signal processing circuit 507 as digital image signals of colors of R, G, and B.

In the imaged signal processing circuit 507, correction processing such as low-pass filtering and shading correction for noise reduction, image signal processing such as white balance adjustment process, and compression processing on image data are performed. It should be noted that the imaged signal processing circuit 507 configured to perform those processes may be internally contained in the image pickup device 506 having the stacked structure.

The lens unit 501 is driven by the lens drive unit 502 to control zooming and focusing, for example. A mechanical shutter 503 and the aperture 504 are drive controlled by a shutter/aperture drive unit 505.

The overall control computing unit 509 generally controls the imaging apparatus and performs computing processes. A first memory unit 508 temporarily stores image data. A detachable recording medium 512 such as a semiconductor memory records image data. A recording-medium control interface unit 510 records image data in the recording medium 512 or reads out image data recorded in the recording medium 512. It should be noted that the overall control computing unit 509 may be internally contained in the image pickup device 506 having the stacked structure.

A display unit 511 is configured to display image data, for example. An external interface unit 513 is usable for communication with an external computer, for example. A second memory unit 514 temporarily stores a computing result from the overall control computing unit 509 and parameters. Information regarding a driving condition of the imaging apparatus set by a user through the operating unit 515 is transmitted to the overall control computing unit 509 so that the overall imaging apparatus can be controlled based on the information.

Next, a dynamic range enlargement method using HDR processing according to this embodiment will be described with reference to FIG. 7 and FIGS. 8A to 8G. The HDR processing includes extracting usable output ranges for each area within images from images of a plurality of frame acquired by capturing an identical subject with different exposures and synthesizing them into one image so that a dynamic range can be enlarged.

As an example, three images of an "under-exposure image" with an exposure of minus 2 levels from a proper exposure, a "proper exposure image" with a proper exposure, and an "over-exposure image" with an exposure plus 2 levels from the proper exposure are captured. An example in which exposures are controlled based on an storage period will be describe below, but exposures may be controlled by other methods such as a method in which the ISO sensitivity (gain) may be differentiated frame by frame, without limiting to control based on an storage period.

Figure 7:
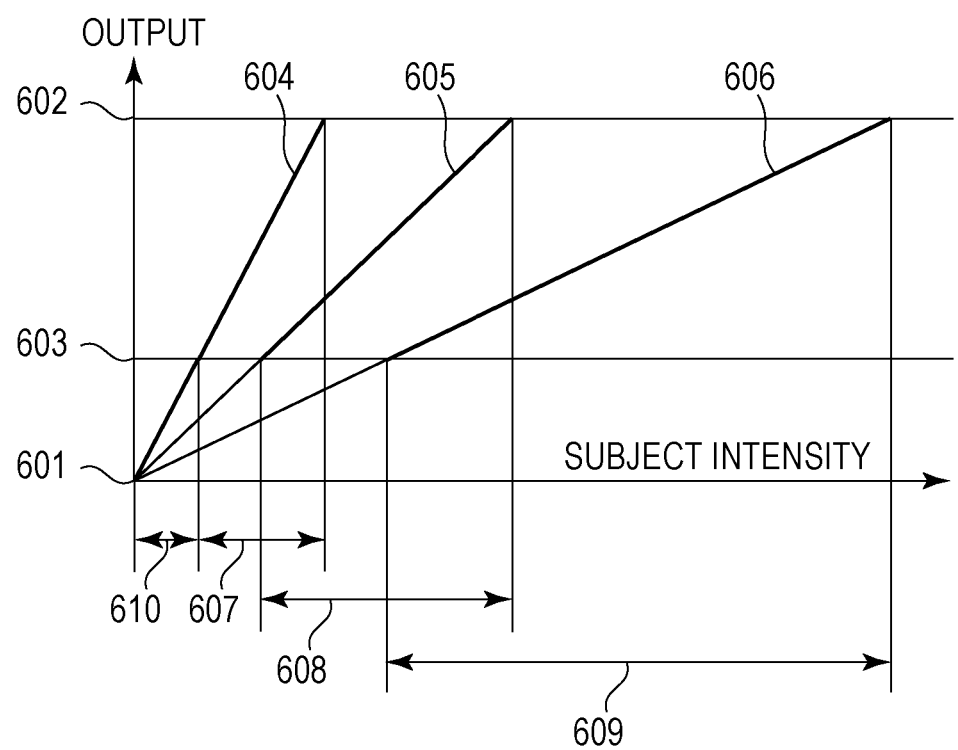
FIG. 7 is an explanatory diagram of a dynamic range enlargement method according to the first embodiment.

FIG. 7 illustrates relationships between exposures and dynamic ranges in a case where the exposures are controlled based on storage periods. FIGS. 8A to 8G illustrate images to be synthesized in HDR with images captured with different exposures. FIG. 7 illustrates a horizontal axis indicating a subject brightness and a vertical axis indicating an output signal level from an image pickup device and an output range from a black level 601 to a saturation level 602.

Figure 8A:
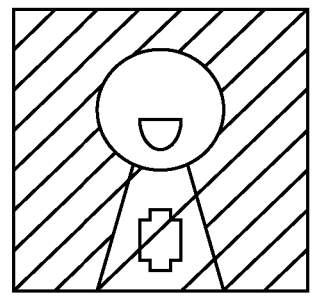
FIG. 8A is an explanatory diagram regarding HDR processing according to the first embodiment.
Figure 8B:
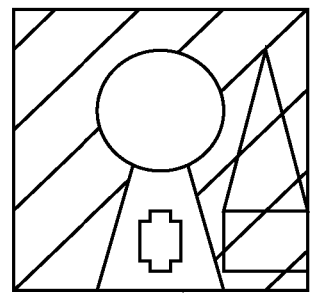
FIG. 8B is an explanatory diagram regarding HDR processing according to the first embodiment.
Figure 8C:
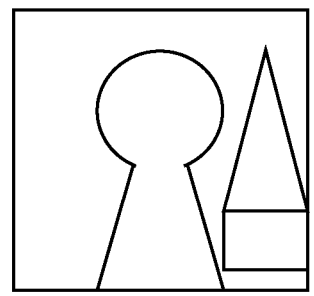
FIG. 8C is an explanatory diagram regarding HDR processing according to the first embodiment.

FIG. 7 plots relationships of signal values to subject brightnesses for each of an under-exposure image 606, a proper exposure image 605, and an over-exposure image 604. The under-exposure image 606 is an image captured with an exposure under a proper exposure as illustrated in FIG. 8A. The proper exposure image 605 is an image captured with the proper exposure as illustrated in FIG. 8B. The over-exposure image 604 is an image capture with an exposure over the proper exposure as illustrated in FIG. 8C.

Next, a dynamic range for each type of exposure will be described. A signal having a level closer to the black level 601 is more susceptible to noise in the output range from the black level 601 to the saturation level 602, and the reliability of the corresponding output value is lower. Assuming the output range susceptible to noise is a range from the level 601 to level 603, the output range usable as an image is a range from the level 603 to the level 602.

Figure 8D:
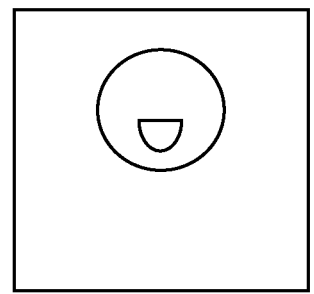
FIG. 8D is an explanatory diagram regarding HDR processing according to the first embodiment.

The subject brightnesses corresponding to the output level range from the level 603 to the level 602 usable in images captured with the different types of exposure can be an output range (dynamic range) usable in the images captured with the different types of exposure. The dynamic range of the under-exposure image 606 is a brightness range 609. FIG. 8D illustrates image data acquired by extracting the brightness range 609 which is a usable output range from the under-exposure image 606 illustrated in FIG. 8A.

Figure 8E:
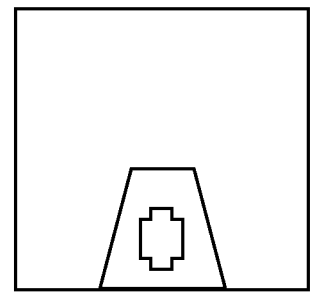
FIG. 8E is an explanatory diagram regarding HDR processing according to the first embodiment.

The dynamic range of the proper exposure image 605 is a brightness range 608. FIG. 8E illustrates image data acquired by extracting the brightness range 608 which is a usable output range from the proper exposure image 605 illustrated in FIG. 8B.

Figure 8F:
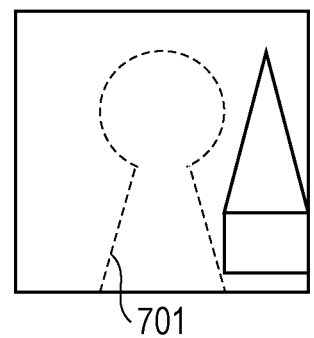
FIG. 8F is an explanatory diagram regarding HDR processing according to the first embodiment.

The dynamic range of the over-exposure image 604 is a brightness range 607. FIG. 8F illustrates image data acquired by extracting the brightness range 607 which is a usable output range from the over-exposure image 604 illustrated in FIG. 8C. FIG. 8F illustrates a background image excluding a human figure and does not include image data within a range indicated by the broken line 701.

In this case, a brightness range lower than the brightness range 609 in the under-exposure image 606 is susceptible noise while the brightness range 610 low than the brightness range 607 in the over-exposure image 604 is not greatly susceptible to noise. Accordingly, in order to acquire the output ranges 601 to 603, image data of the brightness range 610 are used for the over-exposure image 604.

Then, the image data (in FIGS. 8D to 8F) acquired by extracting the image data (FIGS. 8A to 8C) captured under different exposures is synthesized so that image data (FIG. 8G) having a wide dynamic range including the brightness ranges 609, 608, 607, and 610 can be generated.

When such a usable output range is extracted from the image data in FIGS. 8A to 8C, signal extraction may be performed by weighting.

Figure 9:
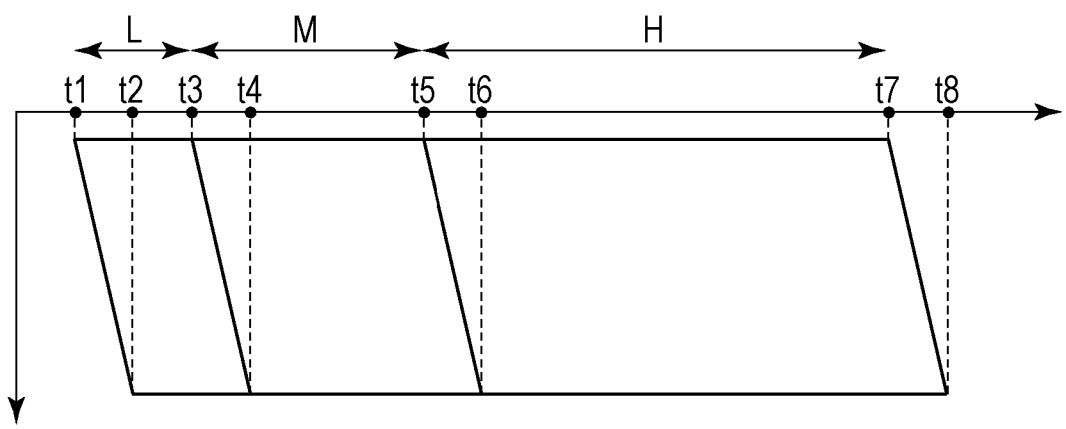
FIG. 9 illustrates readout timing according to the first embodiment.
Figure 10:
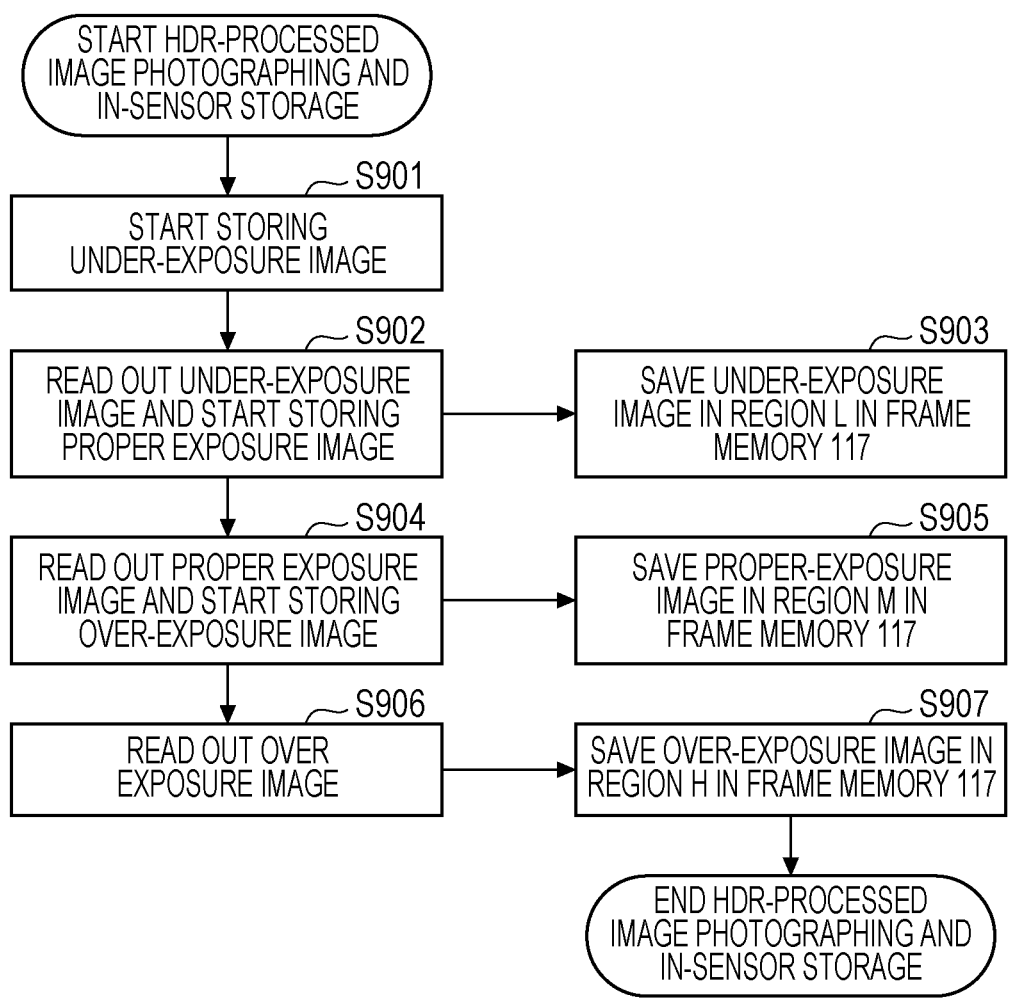
FIG. 10 illustrates a readout flow according to the first embodiment.

Next, processing for acquiring image data of a plurality of frames with different exposures and saving the acquired image data of the plurality of frames in the frame memory within the image pickup device 506 will be described with reference to FIGS. 9 and 10. FIG. 9 illustrates timing of charge storage and signal readout operations performed on each pixel for acquiring image data of three images with different exposures and has a horizontal axis indicating timing and a vertical axis indicating a pixel row in the image pickup device. FIG. 10 is a flowchart illustrating processing to be performed in an imaging apparatus.

In step S901 in FIG. 10, a charge storage operation for an under-exposure image starts. In other words, during a period from a time t1 to a time t2 in FIG. 9, processing for resetting each pixel of each row starts, and a charge storage operation for an under-exposure image starts from the row having completed the resetting. Here, because the image pickup device 506 is driven to perform a rolling readout which reads out signals sequentially from each of rows, the charge storage operation starts at different times between rows.

In step S902, readout of signals of under-exposure image starts, and charge storage of a proper exposure image starts. In other words, during a period from a time t3 to a time t4 in FIG. 9, signal readout of the under-exposure image is performed, and immediately after the signal readout of the under-exposure image of each row, reset processing starts. Sequentially from the reset processing ends, signal charge storage of the proper exposure image starts.

In step S903, the digital image data of the read under-exposure image are saved in an area L of the frame memory 117 within the image pickup device.

In step S904, signal readout of the proper exposure image starts, and storage of charge s of the over-exposure image starts. In other words, during a period from a time t5 to a time t6 in FIG. 9, signal readout of the proper exposure image of each row is performed. Immediately after the signal readout of the proper exposure image of row, reset processing starts, and storage of charge s of the over-exposure image starts from the row having completed the reset processing.

In step S905, digital image data of the read proper exposure image are saved in an area M in the frame memory 117 within the image pickup device.

In step S906, readout of signals of an over-exposure image is performed. In other words, during a period from a time t7 to a time t8 in FIG. 9, signal readout of the over-exposure image of each row is performed.

In step S907, digital image data of the read over-exposure image are saved in an area H in the frame memory 117 within the image pickup device.

Through the processing above, data of a plurality of images with different exposures may be acquired, and the acquired image data may be saved in the frame memory 117 within the image pickup device 506. It should be noted that the frame memory 117 may only be required to have a capacitance sufficient for saving data of at least three images. Having described that according to this embodiment an under-exposure image, a proper exposure image, and an over-exposure image are acquired in the order, embodiments of the present invention are not limited to the order. For example, acquiring a proper exposure image, an under-exposure image, and an over-exposure image in order can bring the positions of the centers of gravity of the exposure images closer.

Figure 11:
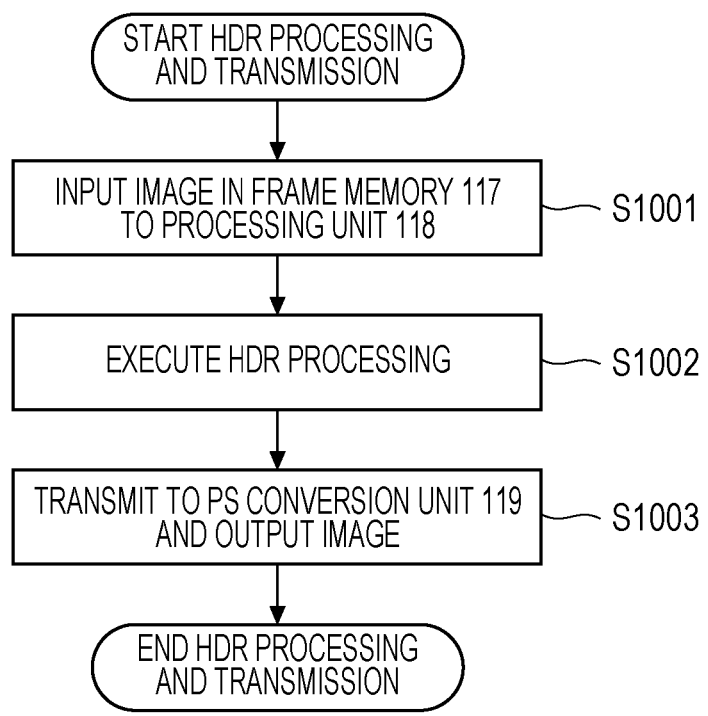
FIG. 11 illustrates HDR processing and transmission flow according to the first embodiment.

Next, processing for generating an HDR image using data of a plurality of images captured with different exposures and saved in the frame memory 117 will be described with reference to the flowchart in FIG. 11.

In step S1001, under control of the overall control computing unit 509, the data of a plurality of images with different exposures saved in the areas L, M, and H in the frame memory 117 are input to the processing unit 118.

Figure 8G:
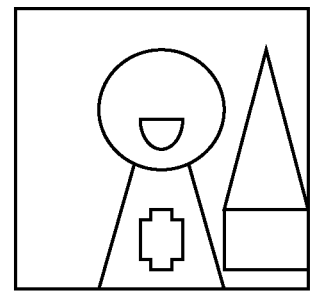
FIG. 8G is an explanatory diagram regarding HDR processing according to the first embodiment.

In step S1002, under control of the overall control computing unit 509, the processing unit 118 performs processing for generating an HDR image using data of a plurality of images with different exposures as described with reference to FIG. 7 and FIGS. 8A and 8G. The computing unit 118 is capable of performing processing for generating an HDR image and processing for synthesizing images.

In other words, image data included in an output level range usable for each area of an image are extracted from data of a plurality of images with different exposures acquired by capturing an identical subject and stored in the area L, M, and H in the frame memory 117. The images are aligned and synthesized to generate one image (HDR image) with a wider dynamic range. The synthesizing includes synthesizing input image data and image data saved in the frame memory 117, and the resulting data is saved in an arbitrary area of the frame memory 117.

In step S1003, under control of the overall control computing unit 509, the HDR image saved in the frame memory 117 is transmitted to the P/S conversion unit 119 and is output to the imaged signal processing circuit 507. By performing the HDR image generating processing as described above, an image having a wide dynamic range can be generated.

Second Embodiment

Figure 12:
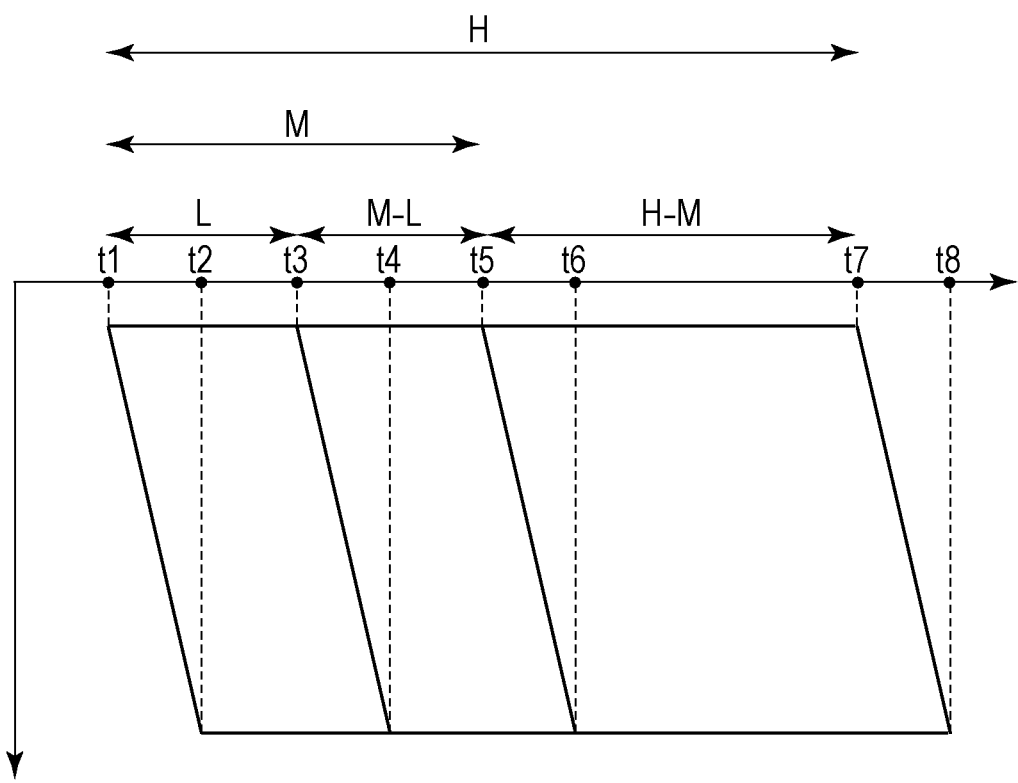
FIG. 12 illustrates readout timing according to a second embodiment.
Figure 13:
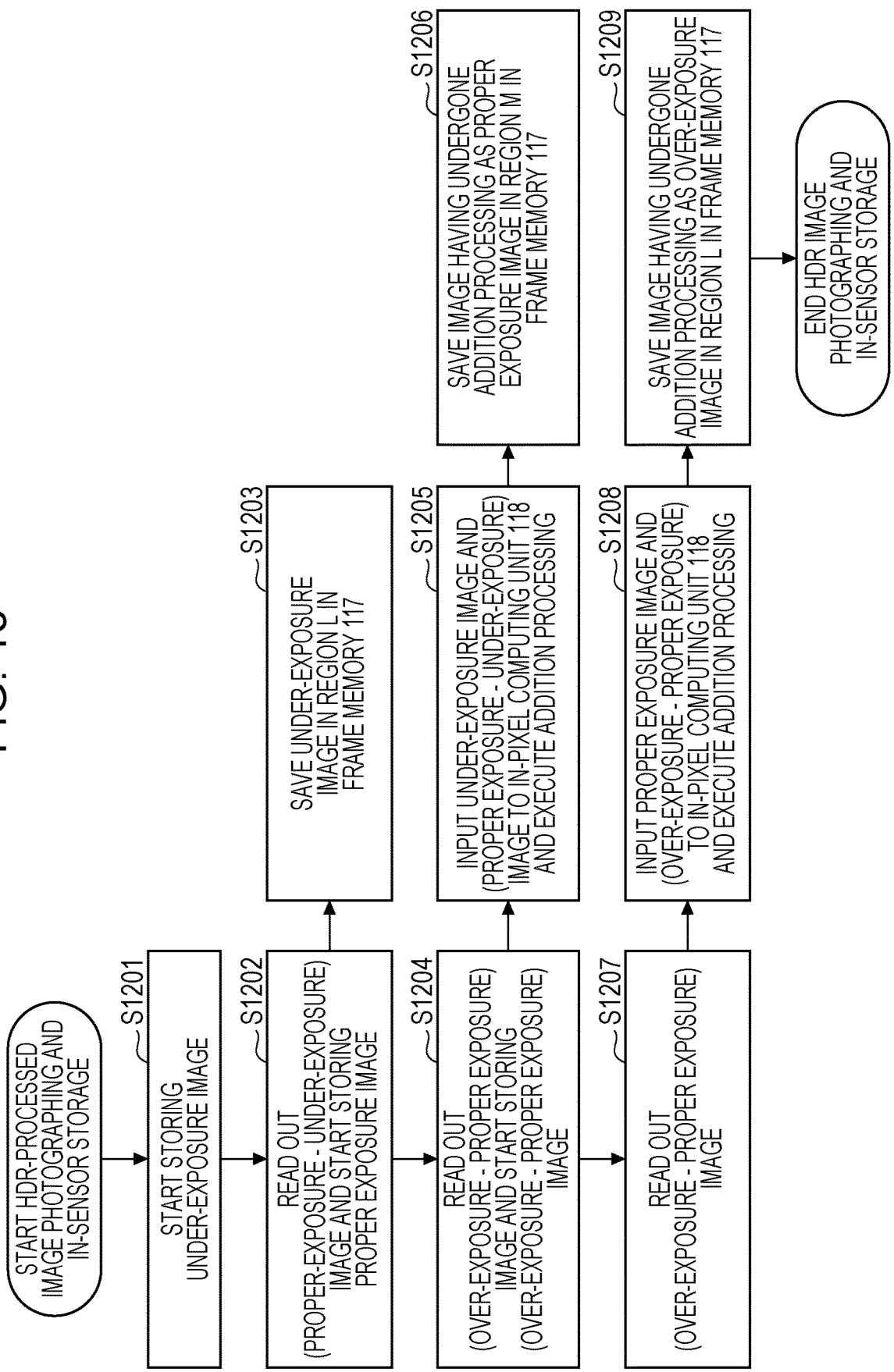
FIG. 13 illustrates a readout flow according to the second embodiment.

With reference to FIGS. 12 and 13, a second embodiment of the present invention will be described below. Because an imaging system and HDR-image generating processing according to the second embodiment are the same as those according to the first embodiment described with reference to FIG. 1 to FIG. 8A to 8G and FIG. 11, the repetitive description will be omitted.

The method according to the first embodiment has been described in which image data having a wider dynamic range is generated from data of a plurality of images sequentially captured with different exposures. However, when the position of a subject changes between images due to a shake of the subject, all areas within the image may not properly synthesized by simply aligning the images before the synthesis.

As a method for alleviating the problem, processing for performing signal readout of image data by starting charge storage at a same time (or by starting exposures at a same time) when image data to be synthesized have overlapped charge storage periods will be described with reference to FIGS. 12 and 13. FIG. 12 illustrates timing of charge storage and signal readout in each pixel for acquiring data of three images with different exposures and has a horizontal axis indicating time and a vertical axis indicating pixel rows in the image pickup device. FIG. 13 is a flowchart illustrating processing to be performed in the imaging apparatus according to the second embodiment.

Also according to the second embodiment, exposures are controlled based on the charge storage periods, and an "under-exposure image" (an image corresponding to an storage period L in FIG. 12), a "proper exposure image-under-exposure image" (an image corresponding to an storage period M-L in FIG. 12), and an "over-exposure image-proper exposure image" (an image corresponding to an storage period H-M in FIG. 12) are sequentially acquired. By performing computing processing thereon, an under-exposure image, a proper exposure image, and an over-exposure image are generated. It should be noted that the under-exposure image has an exposure of minus 2 levels from the proper exposure. The over-exposure image is an image with an exposure plus 2 levels from the proper exposure.

In step S1201 in FIG. 13, charge storage of the under-exposure image starts. In other words, during a period from a time t1 to a time t2 in FIG. 12, processing for resetting each pixel of each row starts, and a charge storage operation for an under-exposure image starts from the row having completed the reset processing. Here, because the image pickup device 506 is driven to perform a rolling readout which reads out signals sequentially from each of the rows, the charge storage operation starts at different times between rows.

In step S1202, readout of signals of under-exposure image starts, and charge storage of the "proper exposure image-under-exposure image" starts. In other words, during a period from a time t3 to a time t4 in FIG. 13, readout signals of the under-exposure image row by row is performed, and immediately after the signal readout of the under-exposure image of each row, reset processing on each row starts. Sequentially from the row having completed the reset processing, charge storage of the "proper exposure image-under-exposure image" starts.

In step S1203, the digital image data of the read under-exposure image are saved in an area L of the frame memory 117.

In step S1204, signal readout of the "proper exposure image-under-exposure image" starts, and storage of charge s of the "over-exposure image-proper exposure image" starts. In other words, during a period from a time t5 to a time t6 in FIG. 13, signal readout of the "proper exposure image-under-exposure image" of each row is performed. Immediately after the signal readout of the "proper exposure image-under-exposure image" of each row, reset processing starts, and storage of charge s of the "over-exposure image-proper exposure image" starts from the row having completed the reset processing.

In step S1205, the "proper exposure image-under-expo-sure image" (the image corresponding to the storage period M-L in FIG. 12) read out in step S1204 and the "under-exposure image" (the image corresponding to the storage period L in FIG. 12) saved in the area L of the frame memory 117 are input to the processing unit 118 in which addition processing is performed thereon. By performing the addition processing, the "proper exposure image" (image corresponding to the storage period M in FIG. 12) can be acquired.

In step S1206, digital image data of the proper exposure image acquired by performing the addition processing are saved in the area M in the frame memory 117.

In step S1207, signal readout of the "over-exposure image-proper exposure image" is performed.

In other words, during a period from a time t7 to a time t8 in FIG. 12, signal readout of the "over-exposure image-proper exposure image" is performed.

In step S1208, the "over-exposure image-proper exposure image" (image corresponding to the storage period H-M in FIG. 12) read out in step S1207 and the "proper exposure image" (image corresponding to the storage period M in FIG. 12) saved in the area M in the frame memory 117 are input to the processing unit 118 in which addition processing is performed thereon. By performing the addition processing, "over-exposure image" (image corresponding to the storage period H in FIG. 12) can be acquired.

In step S1209, digital image data of the over-exposure image acquired by performing the addition processing is saved in the area H in the frame memory 117.

By performing the HDR-image generating processing in the same manner as in the first embodiment by using data of a plurality of images with different exposures the storages of which are started at a same time as described above, the influence of a shake of a subject may be improved, and an image of a wider dynamic range can be generated.

Third Embodiment

Figure 14:
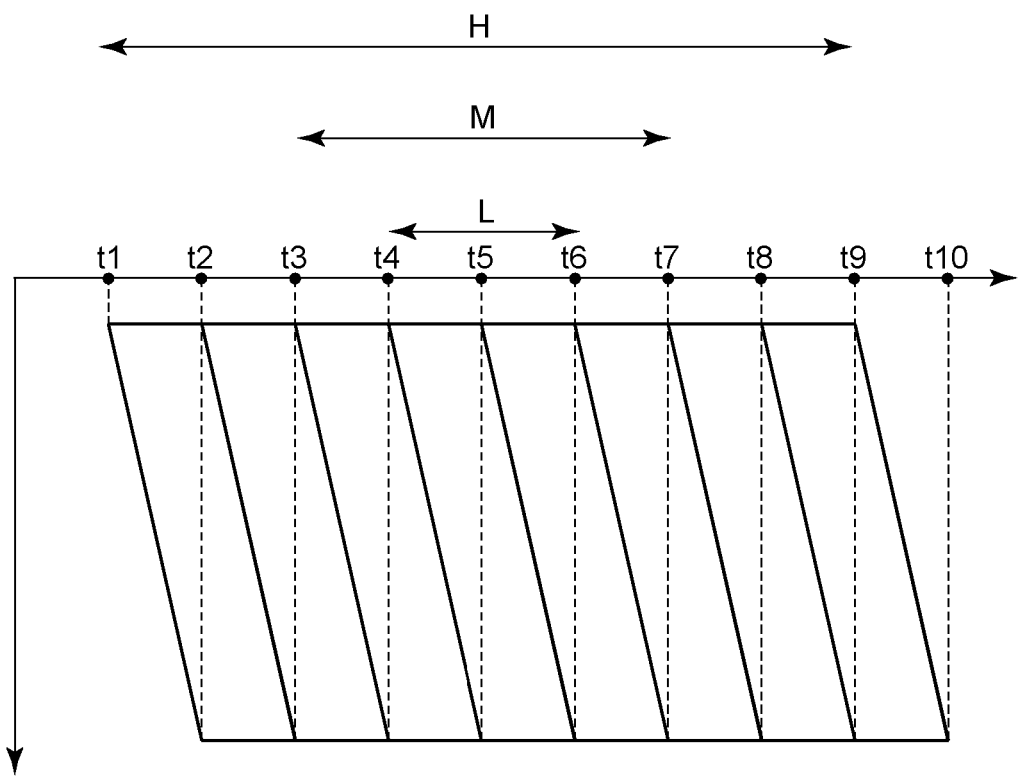
FIG. 14 illustrates readout timing according to a third embodiment.

A third embodiment of the present invention will be described with reference to FIGS. 14 and 15. Because an imaging system and HDR-image generating processing according to the third embodiment are the same as those according to the first embodiment described with reference to FIG. 1 to FIG. 8A to 8G and FIG. 11, the repetitive description will be omitted.

The signal readout method according to the second embodiment has been described in which the storage operations are started at a same time when a plurality of images are captured with different exposures. However, the method according to the second embodiment may not completely overcome influences of a shake of a subject because storages of an under-exposure image and an over-exposure image end at greatly different times.

In order to improve the problem, when a plurality of images is captured with different exposures, intermediate times may occur simultaneously during charge storage periods of the images. According to this embodiment, signal readout processing in which intermediate times can occur simultaneously during charge storage periods of image data with different exposures in post-processing will be described with reference to FIGS. 14 and 15. FIG. 14 illustrates timing of charge storage and signal readout in each pixel for acquiring data of eight images with an equal exposure and has a horizontal axis indicating time and a vertical axis indicating pixel rows in the image pickup device. FIG. 15 is a flowchart illustrating processing to be performed in the imaging apparatus according to the third embodiment.

Also according to the third embodiment, exposures are controlled based on the charge storage periods, and a plurality of images (hereinafter, called "divided exposure images") with an exposure minus 2 levels from a proper exposure are continuously acquired. By performing computing processing, an under-exposure image (an image corresponding to a storage period L in FIG. 14), a proper exposure image (an image corresponding to a storage period M in FIG. 14), and an over-exposure image (an image corresponding to a storage period L in FIG. 14) are generated.

Figure 15:
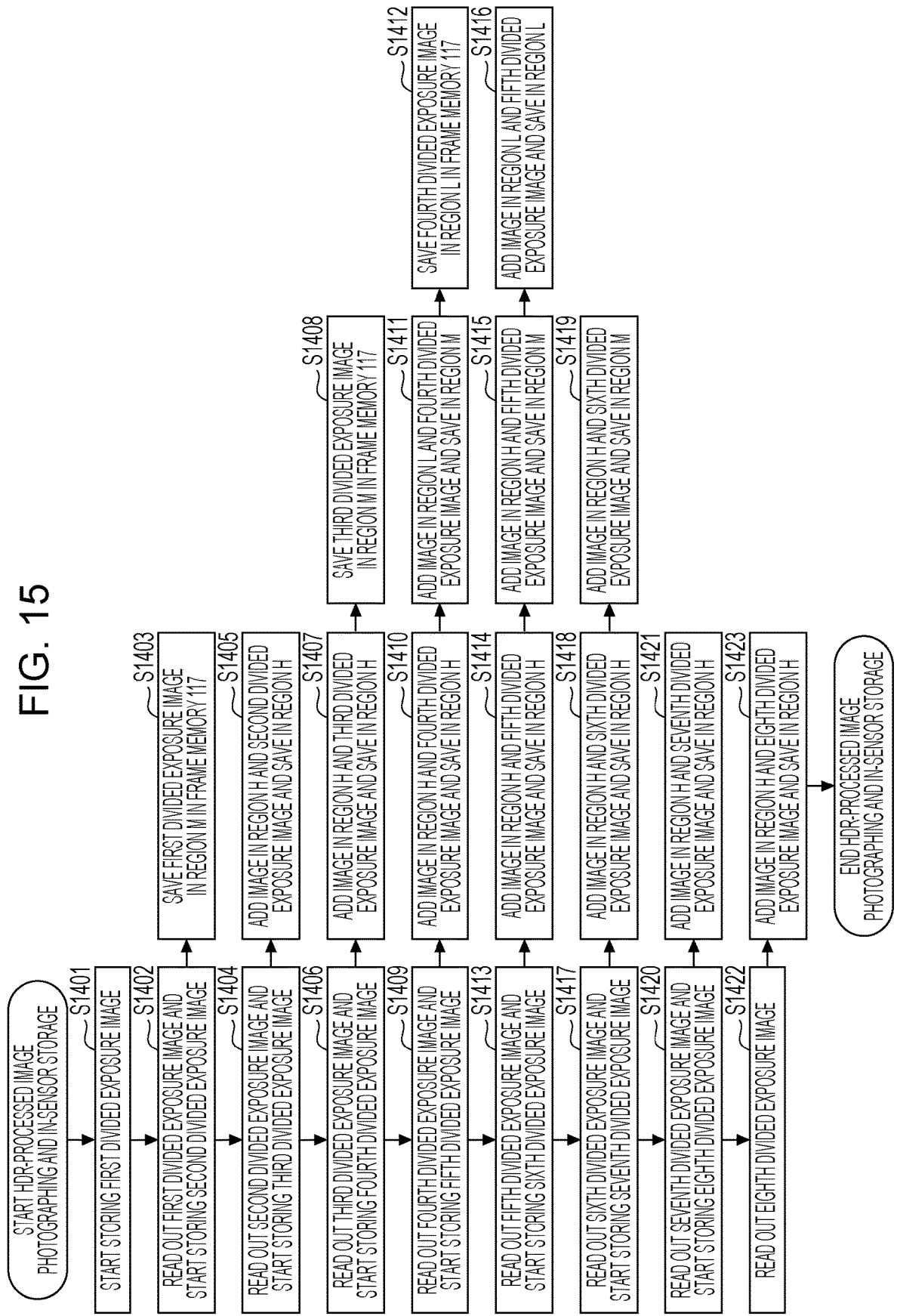
FIG. 15 illustrates a readout flow according to the third embodiment.
Figure 16:
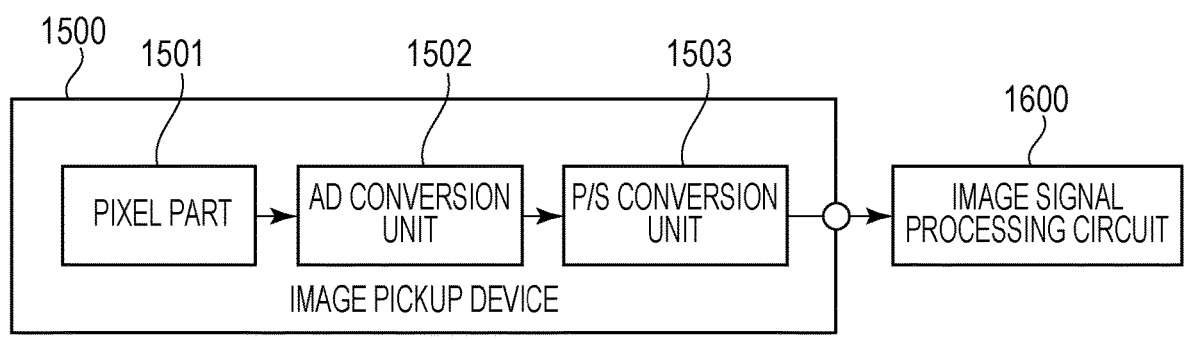
FIG. 16 illustrates a configuration of a general imaging apparatus.

In step S1401 in FIG. 15, charge storage of the first divided exposure image starts. In other words, during a period from a time t1 to a time t2 in FIG. 14, processing for resetting each pixel of each row starts, and a charge storage operation for the first divided exposure image starts. Here, because the image pickup device 506 is driven to perform a rolling readout which reads out signals sequentially from each of rows, the charge storage operation starts at different times between rows.

In step S1402, signal readout of the first divided exposure image starts, and charge storage of the second divided exposure image starts. In other words, during a period from a time t2 to a time t3 in FIG. 14, readout of the first divided exposure image row by row is performed, and immediately after the readout of the first divided exposure image of each row, reset processing on each row starts. Sequentially from the row having completed the reset processing, charge storage of the second divided exposure image starts.

In step S1403, digital image data of the readout first divided exposure image are saved in an area H of the frame memory 117.

In step S1404, signal readout of the second divided exposure image starts, and charge storage of a third divided exposure image starts. In other words, during a period from a time t3 to a time t4 in FIG. 14, readout of the second divided exposure image row by row is performed, and immediately after the readout of the second divided exposure image of each row, reset processing on each row starts. Sequentially from the row having completed the reset processing, charge storage of the third divided exposure image starts.

In step S1405, the second divided exposure image read out in step S1404 and the image saved in the area H of the frame memory 117 undergo addition processing in the processing unit 118, and the resulting data are saved in the area H.

In step S1406, signal readout of the third divided exposure image starts, and charge storage of a fourth divided exposure image starts. In other words, during a period from a time t4 to a time t5 in FIG. 14, readout of the third divided exposure image row by row is performed, and immediately after the readout of the third divided exposure image of each row, reset processing on each row starts. Sequentially from the row having completed the reset processing, charge storage of the fourth divided exposure image starts.

In step S1407, the third divided exposure image read out in step S1406 and the image saved in the area H of the frame memory 117 undergo addition processing in the processing unit 118, and the resulting data are saved in the area H.

In step S1408, the read out third divided exposure image is saved in the area M of the frame memory 117.

In step S1409, signal readout of the fourth divided exposure image starts, and charge storage of a fifth divided exposure image starts. In other words, during a period from a time t5 to a time t6 in FIG. 14, readout of the fourth divided exposure image row by row is performed, and immediately after the readout of the fourth divided exposure image of each row, reset processing on each row starts. Sequentially from the row having completed the reset processing, charge storage of the fifth divided exposure image starts.

In step S1410, the fourth divided exposure image read out in step S1409 and the image saved in the area H of the frame memory 117 undergo addition processing in the processing unit 118, and the resulting data is saved in the area H.

In step S1411, the read out fourth divided exposure image and the image saved in the area M of the frame memory 117 undergo addition processing in the processing unit 118, and the resulting data is saved in the area M.

In step S1411, the read out fourth divided exposure image and the image saved in the area M of the frame memory 117 undergo addition processing in the processing unit 118, and the resulting data are saved in the area M.

In step S1412, the readout fourth divided exposure image is saved in the area L of the frame memory 117.

In step S1413, signal readout of the fifth divided exposure image starts, and charge storage of a sixth divided exposure image starts. In other words, during a period from a time t6 to a time t7 in FIG. 14, readout of the fifth divided exposure image row by row is performed, and immediately after the readout of the fifth divided exposure image of each row, reset processing on each row starts. Sequentially from the row having completed the reset processing, charge storage of the sixth divided exposure image starts.

In step S1414, the fifth divided exposure image read out in step S1413 and the image saved in the area H of the frame memory 117 undergo addition processing in the processing unit 118, and the resulting data is saved in the area H.

In step S1415, the read out fifth divided exposure image and the image saved in the area M of the frame memory 117 undergo addition processing in the processing unit 118, and the resulting data is saved in the area M.

In step S1416, the read out fifth divided exposure image and the image saved in the area L of the frame memory 117 undergo addition processing in the processing unit 118, and the resulting data is saved in the area L.

In step S1417, signal readout of the sixth divided exposure image starts, and charge storage of a seventh divided exposure image starts. In other words, during a period from a time t7 to a time t8 in FIG. 14, readout of the sixth divided exposure image row by row is performed, and immediately after the readout of the sixth divided exposure image of each row, reset processing on each row starts. Sequentially from the row having completed the reset processing, charge storage of the seventh divided exposure image starts.

In step S1418, the sixth divided exposure image read out in step S1417 and the image saved in the area H of the frame memory 117 undergo addition processing in the processing unit 118, and the resulting data is saved in the area H.

In step S1419, the read out sixth divided exposure image and the image saved in the area M of the frame memory 117 undergo addition processing in the processing unit 118, and the resulting data is saved in the area M.

In step S1420, signal readout of the seventh divided exposure image starts, and charge storage of a eighth divided exposure image starts. In other words, during a period from a time t8 to a time t9 in FIG. 14, readout of the seventh divided exposure image row by row is performed, and immediately after the readout of the seventh divided exposure image of each row, reset processing on each row starts. Sequentially from the row having completed the reset processing, charge storage of the eighth divided exposure image starts.

In step S1421, the seventh divided exposure image read out in step S1420 and the image saved in the area H of the frame memory 117 undergo addition processing in the processing unit 118, and the resulting data are saved in the area H.

In step S1422, readout of the eighth divided exposure image starts. In other words, during a period from a time t9 to a time t10 in FIG. 14, readout of the eighth under-exposure image row by row is performed.

In step S1423, the eighth divided exposure image read out in step S1422 and the image saved in the area H of the frame memory 117 undergo addition processing in the processing unit 118, and the resulting data is saved in the area H.

By performing the aforementioned processing, data of a plurality of images with different exposures to be used for the HDR-image generating processing can be saved in the areas H, M, and L of the frame memory 117.

Performing the HDR-image generating processing using the acquired data of the plurality of images with different exposures allows intermediate times of the plurality of images captured with different exposures to occur simultaneously, like the first embodiment, so that influences of a shake of a subject can be improved, and an image having a wider dynamic range can be generated.

It should be noted that the position alignment may be performed before the addition processing is performed on the images. The position alignment processing before the HDR-image generating processing may be performed such that the positions of the fourth and fifth divided exposure images which are used in all exposure images can match for synthesis thereof. The subsequent processing is the same as that of the first and second embodiments.

Having described embodiments of the present invention, the present invention is not limited to those embodiments and can be modified and changed variously without departing from the spirit and scope.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-109427, filed May 29, 2015, and Japanese Patent Application No. 2016-086545, filed Apr. 22, 2016, which are hereby incorporated by reference herein in their entirety.

The invention claimed is:

1. An image pickup device having a plurality of semiconductor substrates being mutually stacked, the image pickup device comprising:
a plurality of pixels which photoelectrically convert incident light;
a plurality of AD converters which convert analog image signals output from the plurality of pixels to digital image data;
a processor which synthesizes a plurality of digital image data acquired by a plurality of image capturing operations so that the plurality of digital image data with different exposures can be generated; and
an output circuit which outputs high dynamic range image data out of the image pickup device,
wherein digital image data with an exposure lower than a predetermined exposure is generated from first captured digital image data, digital image data with the predetermined exposure is generated from the first captured digital image data and second captured digital image data, and digital image data with an exposure higher than the predetermined exposure is generated from the first captured digital image data and third captured digital image data.

2. The image pickup device according to claim 1, wherein the processor is provided on one of the plurality of semiconductor substrates, and the plurality of pixels are provided on another one of the plurality of semiconductor substrates.

3. The image pickup device according to claim 1, further comprising a frame memory which stores the digital image data of at least one frame converted by the plurality of AD converters.

4. An image pickup device having a plurality of semiconductor substrates being mutually stacked, comprising:
a plurality of pixels which photoelectrically convert incident light;
a plurality of AD converters which convert analog image signals output from the plurality of pixels to digital image data;
a processor which synthesizes a plurality of digital image data acquired by a plurality of image capturing operations so that the plurality of digital image data with different exposures can be generated; and
an output circuit which outputs high dynamic range image data out of the image pickup device,
wherein digital image data with an exposure lower than a predetermined exposure is generated from two or more digital image data of the plurality of digital image data, digital image data with the predetermined exposure is generated from three or more digital image data of the plurality of digital image data, and digital image data with an exposure higher than the predetermined exposure is generated from all digital image data of the plurality of digital image data.

5. The image pickup device according to claim 4, wherein the processor synthesizes the plurality of digital image data with different exposures such that intermediate times of storage periods can be matched.

6. The image pickup device according to claim 4, wherein the processor is provided on one of the plurality of semiconductor substrates, and the plurality of pixels are provided on another one of the plurality of semiconductor substrates.

7. The image pickup device according to claim 4, further comprising a frame memory which stores the digital image data of at least one frame converted by the plurality of AD converters.

8. An imaging apparatus comprising:
an image pickup device having a plurality of semiconductor substrates being mutually stacked, the image pickup device including (1) a plurality of pixels which photoelectrically convert incident light, (2) a plurality of AD converters which convert analog image signals output from the plurality of pixels to digital image data, (3) a processor which synthesizes a plurality of digital image data acquired by a plurality of image capturing operations so that the plurality of digital image data with different exposures can be generated, and (4) an output circuit which outputs high dynamic range image data out of the image pickup device, wherein digital image data with an exposure lower than the predetermined exposure is generated from first captured digital image data, digital image data with the predetermined exposure is generated from the first captured digital image data and second captured digital image data, and digital image data with an exposure higher than the predetermined exposure is generated from the first captured digital image data and third captured digital image data;

a signal processor which performs a predetermined signal process on the high dynamic range image output from the image pickup device;

a display which displays the high dynamic range image having been processed by the signal processor; and a controller which controls the image pickup device, the signal processor, and the display.

9. The imaging apparatus according to claim 8, wherein the processor is provided on one of the plurality of semiconductor substrates, and the plurality of pixels are provided on another one of the plurality of semiconductor substrates.

10. The imaging apparatus according to claim 8, wherein the image pickup device further comprising a frame memory which stores the digital image data of at least one frame converted by the plurality of AD converters.

11. An imaging apparatus comprising:

an image pickup device having a plurality of semiconductor substrates being mutually stacked, the image pickup device including (1) a plurality of pixels which photoelectrically convert incident light, (2) a plurality of AD converters which convert analog image signals output from the plurality of pixels to digital image data, (3) a processor which synthesizes a plurality of digital image data acquired by a plurality of image capturing operations so that the plurality of digital image data with different exposures can be generated, and (4) an output circuit which outputs high dynamic range image data out of the image pickup device, wherein digital image data with an exposure lower than the predetermined exposure is generated from two or more digital image data of the plurality of digital image data, digital image data with the predetermined exposure is generated from three or more digital image data of the plurality of digital image data, and digital image data with an exposure higher than the predetermined exposure is generated from all digital image data of the plurality of digital image data;

a signal processor which performs a predetermined signal process on the high dynamic range image output from the image pickup device;

a display which displays the high dynamic range image having been processed by the signal processor; and a controller which controls the image pickup device, the signal processor, and the display.

12. The imaging apparatus according to claim 11, wherein the processor synthesizes the plurality of digital image data with different exposures such that intermediate times of storage periods can be matched.

13. The imaging apparatus according to claim 11, wherein the processor is provided on one of the plurality of semiconductor substrates, and the plurality of pixels are provided on another one of the plurality of semiconductor substrates.

14. The imaging apparatus according to claim 11, wherein the image pickup device further comprising a frame memory which stores the digital image data of at least one frame converted by the plurality of AD converters.

* * * * *